(12) United States Patent
Wieting

(10) Patent No.: US 8,217,261 B2
(45) Date of Patent: *Jul. 10, 2012

(54) THIN FILM SODIUM SPECIES BARRIER METHOD AND STRUCTURE FOR CIGS BASED THIN FILM PHOTOVOLTAIC CELL

(75) Inventor: Robert D. Wieting, San Jose, CA (US)

(73) Assignee: Stion Corporation, San Jose, CA (US)

( * ) Notice: Subject to any disclaimer, the term of this patent is extended or adjusted under 35 U.S.C. 154(b) by 214 days.

This patent is subject to a terminal disclaimer.

(21) Appl. No.: 12/567,698

(22) Filed: Sep. 25, 2009

(65) Prior Publication Data

US 2010/0258179 A1    Oct. 14, 2010

Related U.S. Application Data

(60) Provisional application No. 61/101,646, filed on Sep. 30, 2008.

(51) Int. Cl.
*H01L 31/00* (2006.01)
(52) U.S. Cl. .................. 136/265; 136/262; 136/264
(58) Field of Classification Search .................. 136/262
See application file for complete search history.

(56) References Cited

U.S. PATENT DOCUMENTS

| | | | |
|---|---|---|---|
| 4,996,108 A | 2/1991 | Divigalpitiya et al. | |
| 5,125,984 A | 6/1992 | Kruehler et al. | |
| 5,261,968 A | 11/1993 | Jordan | |
| 5,501,744 A | 3/1996 | Albright et al. | |
| 5,536,333 A | 7/1996 | Foote et al. | |
| 5,578,103 A | 11/1996 | Araujo et al. | |
| 5,626,688 A * | 5/1997 | Probst et al. ................ | 136/265 |
| 5,665,175 A | 9/1997 | Safir | |
| 5,985,691 A * | 11/1999 | Basol et al. ................ | 438/95 |
| 6,258,620 B1 | 7/2001 | Morel et al. | |
| 6,310,281 B1 * | 10/2001 | Wendt et al. ................ | 136/256 |
| 6,328,871 B1 | 12/2001 | Ding et al. | |
| 7,235,736 B1 * | 6/2007 | Buller et al. ................ | 136/251 |
| 2006/0219288 A1 | 10/2006 | Tuttle | |

(Continued)

OTHER PUBLICATIONS

J. Scofield, Sodium diffusion, selenization, and microstructural effects associated with various molybdenum back contact layers for CIS-based solar cells, 1995, IEEE, 164-167.*

(Continued)

*Primary Examiner* — Jennifer Michener
*Assistant Examiner* — Miriam Berdichevsky
(74) *Attorney, Agent, or Firm* — Kilpatrick Townsend & Stockton LLP

(57) ABSTRACT

A method for fabricating a thin film solar cell includes providing a soda lime glass substrate comprising a surface region and a concentration of sodium oxide of greater than about 10 wt % and treating the surface region with one or more cleaning process, using a deionized water rinse, to remove surface contaminants having a particles size of greater than three microns. The method also includes forming a barrier layer overlying the surface region, forming a first molybdenum layer in tensile configuration overlying the barrier layer, and forming a second molybdenum layer in compressive configuration using a second process overlying the first molybdenum layer. Additionally, the method includes patterning the first molybdenum layer and the second molybdenum layer to form a lower electrode layer and forming a layer of photovoltaic material overlying the lower electrode layer. Moreover, the method includes forming a first zinc oxide layer overlying the layer of photovoltaic materials.

17 Claims, 9 Drawing Sheets

U.S. PATENT DOCUMENTS

| | | | |
|---|---|---|---|
| 2006/0220059 | A1 | 10/2006 | Satoh et al. |
| 2007/0089782 | A1 | 4/2007 | Scheuten et al. |
| 2007/0151596 | A1 | 7/2007 | Nasuno et al. |
| 2007/0169810 | A1 | 7/2007 | Van Duren et al. |
| 2008/0041446 | A1 | 2/2008 | Wu et al. |
| 2008/0092945 | A1 | 4/2008 | Munteanu et al. |
| 2008/0092953 | A1 | 4/2008 | Lee |
| 2008/0121277 | A1* | 5/2008 | Robinson et al. .............. 136/256 |
| 2009/0021157 | A1* | 1/2009 | Kim et al. ..................... 313/504 |

OTHER PUBLICATIONS

G. Gordillo, F. Mesa, C. Calderon, Electrical and morphological properties of low resistivity Mo thin films prepared by magnetron sputtering, Sep. 2006, Brazilian Journal of Physics, 36, 3B, 982-985.*

International Search Report & Written Opinion of PCT Application No. PCT/US/09/59097, date of mailing Dec. 23, 2009,12 pages total.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

* cited by examiner

THIN FILM SODIUM SPECIES BARRIER METHOD AND STRUCTURE FOR CIGS BASED THIN FILM PHOTOVOLTAIC CELL

CROSS-REFERENCES TO RELATED APPLICATIONS

This application claims priority to U.S. Provisional Patent Application No. 61/101,645, filed Sep. 30, 2008, entitled "THIN FILM SODIUM SPECIES BARRIER METHOD AND STRUCTURE FOR CIGS BASED THIN FILM PHOTOVOLTAIC CELL" by inventor Robert D. Wieting, commonly assigned and incorporated by reference herein for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates generally to photovoltaic materials and manufacturing method. More particularly, the present invention provides a method and structure for fabricating thin film solar cells. Merely by way of example, the present method and structure for manufacture of copper indium gallium diselenide based thin film photovoltaic devices, but it would be recognized that the invention may have other configurations.

From the beginning of time, mankind has been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. Furthermore, integration of electrode layers, sodium-containing glass substrates, and overlying absorber layers was also problematic. These and other limitations of these conventional technologies can be found throughout the present specification and more particularly below.

BRIEF SUMMARY OF THE INVENTION

The present invention relates generally to photovoltaic materials and manufacturing method. More particularly, the present invention provides a method and structure for fabricating thin film solar cells. Merely by way of example, the present method and structure for manufacture of copper indium gallium diselenide based thin film photovoltaic devices, but it would be recognized that the invention may have other configurations.

In a specific embodiment, the present invention provides a method for fabricating a thin film solar cell. The method includes providing a soda lime glass substrate comprising a surface region and a concentration of sodium oxide of greater than about 10 percent by weight. The method further includes treating the surface region with one or more cleaning process, using a deionized water rinse, to remove surface contaminants having a particles size of greater than three microns. Additionally, the method includes process of forming a barrier layer overlying the surface region. The barrier layer is characterized to maintain the sodium within the soda lime glass substrate. The method further includes a first process of forming a first molybdenum layer overlying the barrier layer. The first molybdenum layer has a first thickness and is in tensile configuration. The method also includes a second process of forming a second molybdenum layer overlying the first molybdenum layer. The second molybdenum layer has a second thickness, which is greater than the first thickness, and is in compressive configuration. Furthermore, the method includes patterning the first molybdenum layer and the second molybdenum layer to form a lower electrode layer. Moreover, the method includes forming a layer of photovoltaic material overlying the lower electrode layer and forming a first zinc oxide layer overlying the layer of photovoltaic materials.

In another specific embodiment, the present invention provides a method for fabricating a thin film solar cell. The method includes providing a soda lime glass substrate comprising a surface region and a concentration of sodium oxide of greater than about 10 percent by weight. The method further includes forming a barrier layer overlying the surface region. The barrier layer is characterized to maintain sodium within the soda lime glass substrate. Additionally, the method includes forming a first molybdenum layer using a first process overlying the barrier layer. The first molybdenum layer has a first thickness and is in tensile configuration. The method also includes forming a second molybdenum layer using a second process overlying the first molybdenum layer. The second molybdenum layer has a second thickness, which is greater than the first thickness, and is in compressive configuration. Furthermore, the method includes patterning the first molybdenum layer and the second molybdenum layer to form a lower electrode layer. Moreover, the method includes forming an absorber material comprising a copper species, a gallium species, an indium species, and a selenium species overlying the lower electrode layer and forming a first zinc oxide layer overlying the absorber material.

In an alternative embodiment, the present invention provides a thin film solar cell device. The thin film solar cell device includes a soda lime glass substrate comprising a surface region and a concentration of sodium oxide of greater than about 10 percent by weight. The thin film solar cell device further includes a barrier layer overlying the surface region to maintain the sodium within the soda lime glass substrate. Additionally, the thin film solar cell device includes a lower electrode layer comprising a first molybdenum layer overlying the barrier layer and a second molybdenum layer overlying the first molybdenum layer. The first molybdenum layer has a first thickness and is in tensile configuration, and the second molybdenum layer has a second thickness, which is greater than the first thickness, and is in compressive configuration. Furthermore, the thin film solar cell device includes an absorber material comprising a copper species, an indium species, a gallium species, and a selenium species overlying the lower electrode layer and a first zinc oxide layer overlying the absorber material.

In certain specific embodiments, the photovoltaic absorber layer is a copper indium diselenide compound semiconductor film in chalcopyrite structure or a copper indium gallium diselenide material. In some other embodiments, the absorber layer is covered by a window layer with wide band gap or different dopings. The window layer can be cadmium sulfide (CdS), a zinc sulfide (ZnS), zinc selinium (ZnSe), zinc oxide (ZnO), zinc magnesium oxide (ZnMgO), or others. In yet other embodiments, the first zinc oxide layer, served as the upper electrode layer of the thin film solar cell device, can be formed after a formation of a second zinc oxide layer over the absorber layer. In particular, the second zinc oxide layer has a higher resistivity than the first zinc oxide layer.

Many benefits can be achieved by applying the embodiments of the present invention. Particularly, a thin barrier layer serves an important diffusion barrier for keeping sodium-bearing species within the soda lime glass substrate used for forming a thin film photovoltaic cell. The barrier layer prevents uncontrolled excessive sodium to react with molybdenum electrode layer or causing film grain degradation during formation of a film of copper indium diselenide in chalcopyrite structure with large grain sizes for achieving high efficiency of thin film solar cells thereof. Embodiments of the invention also include forming a bi-layered molybdenum electrode layer with specific layered compressive/tensile stress and thickness control through a process control. Accordingly the bi-layered electrode layer is particularly suitable for laser patterning to form a desired lower electrode layer for fabricating a thin film solar cell. Of course, there can be other variations, modifications, and alternatives.

These and other benefits may be described throughout the present specification and more particularly below.

DETAILED DESCRIPTION OF THE INVENTION

The present invention relates generally to photovoltaic materials and manufacturing method. More particularly, the present invention provides a method and structure for fabricating thin film solar cells. Merely by way of example, the present method and structure for manufacture of copper indium gallium diselenide based thin film photovoltaic devices, but it would be recognized that the invention may have other configurations.

Figure 1:
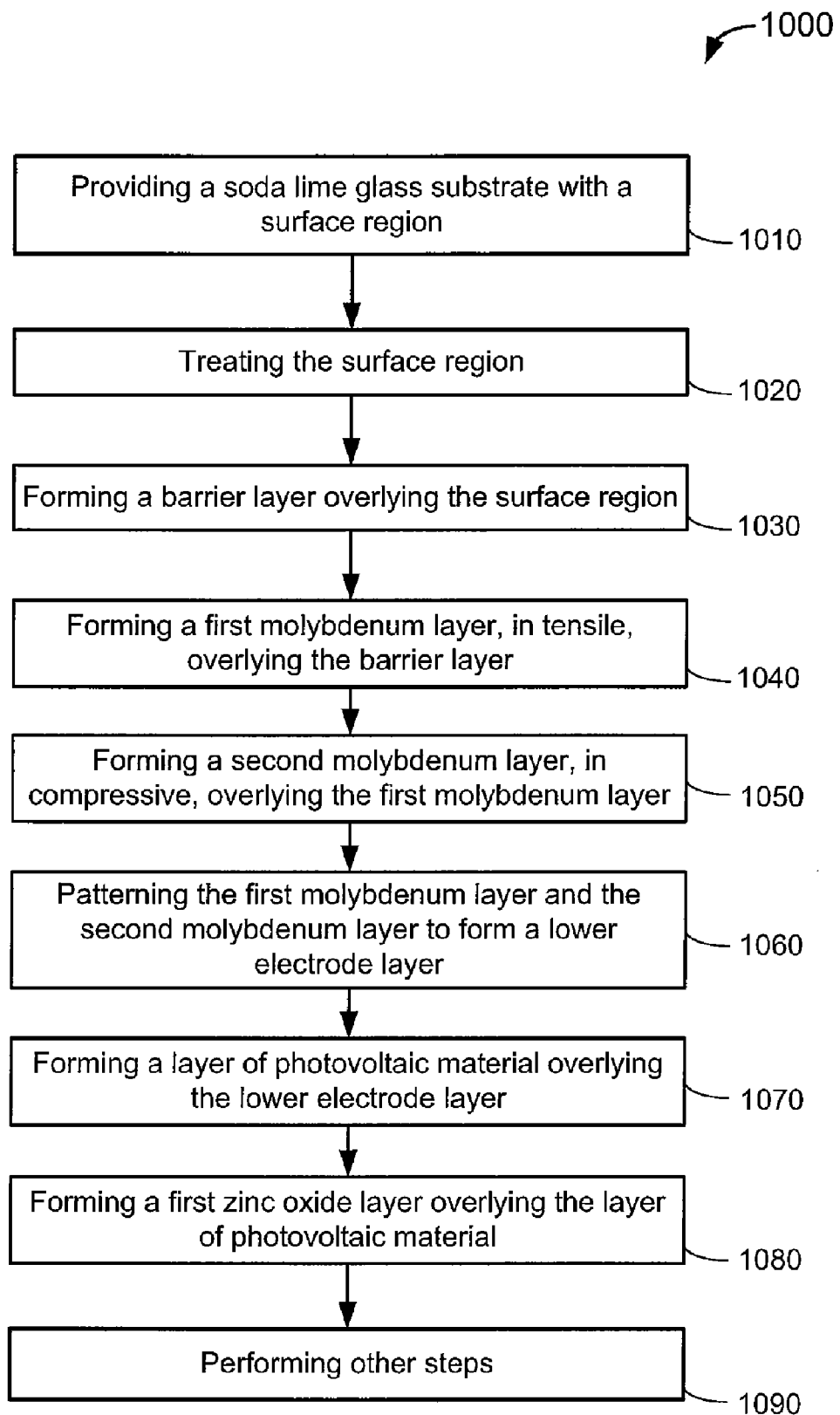
FIG. 1 is a simplified flowchart illustrating a method of fabricating a thin film solar cell according to an embodiment of the present invention.

FIG. 1 is a simplified flowchart illustrating a method of fabricating a thin film solar cell according to an embodiment of the present invention. This diagram is merely an example, which should not unduly limit the scope of the claims herein. The method 1000 includes the following processes:

1. Process 1010 for providing a soda lime glass substrate with a surface region;
2. Process 1020 for treating the surface region;
3. Process 1030 for forming a barrier layer overlying the surface region;
4. Process 1040 for forming a first molybdenum layer, using a first process, overlying the barrier layer;
5. Process 1050 for forming a second molybdenum layer, using a second process, overlying the first molybdenum layer;
6. Process 1060 for patterning the first molybdenum layer and the second molybdenum layer to form a lower electrode layer;
7. Process 1070 for forming a layer of photovoltaic material overlying the lower electrode layer;
8. Process 1080 for forming a first zinc oxide layer overlying the layer of photovoltaic material;
9. Process 1090 for performing other steps.

The above sequence of processes provides a method of using a thin film barrier structure in processes for manufacture of thin film solar cells according to an embodiment of the present invention. The method is applied to the copper indium gallium diselenide based thin film photovoltaic cell. Other alternatives can also be provided where processes are added, one or more processes are removed, or one or more processes are provided in a different sequence without departing from the scope of the claims herein. For example, forming the layer of photovoltaic material may include formation of a multiple layered structure involving many processes including deposition, annealing, etching, patterning, doping, and so on. In another example, the formation of the first zinc oxide layer may be carried out after a formation of a second zinc oxide layer overlying the layer of photovoltaic material, the second zinc oxide having different electric property from the first zinc oxide layer. Further details of the method can be found throughout the present specification and more particularly below.

Figure 2:
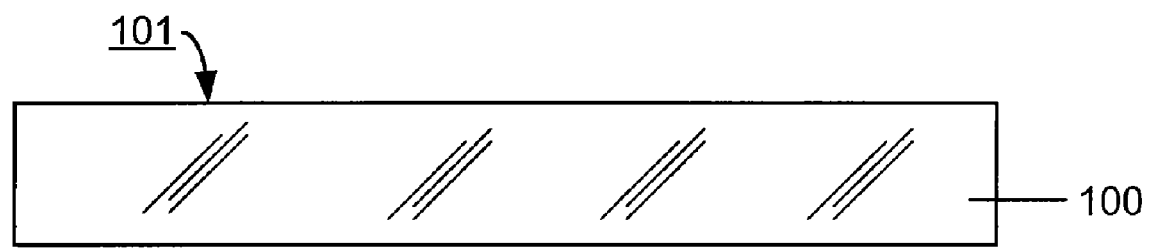
FIGS. 2-7, 7A-7E, and 8-12 are schematic diagrams illustrating a method comprising a series of steps for fabricating a thin film solar cell according to certain embodiments of the present invention.

At Process 1010, a soda lime glass substrate is provided. This process can be visually illustrated by FIG. 2. FIG. 2 is a simplified diagram illustrating a soda lime glass substrate provided for fabricating a thin film solar cell according to an embodiment of the present invention. This diagram is merely an example, which should not unduly limit the scope of the claims herein. One of ordinary skill in the art would recognize many variations, alternatives, and modifications. As shown, the soda lime glass substrate 100 including a surface region 101 is provided. In one embodiment, the soda lime glass contains alkaline ions, for example greater 10 wt % sodium oxide, or about 15% wt % sodium. It has been known that alkali-containing glass substrates are one of most widely used, inexpensive float window glasses, which are also widely used for forming thin film solar cells with low cost. One important reason for choosing the soda lime glass other than economical concern is to utilize its coefficient of thermal expansion of about 9.5 ppm/K, at ~25-600° C. that matches quite well with high efficiency thin film photovoltaic materials formed thereon. In addition, another reason for using the soda lime glass substrate is to utilize a positive influence from the alkaline ions (e.g., or simply sodium-bearing species) on the grain growth during the formation of the thin film photovoltaic materials. For example, polycrystalline compound semiconductor chalcopyrite thin films of CuIn(Ga)Se$_2$ or CuInSe$_2$ materials can be formed on soda lime glass substrates with coarse grain size of 1 microns or larger so that high cell current can be collected with these photovoltaic films with light-conversion efficiencies of 17% or above. On some commercial soda lime glass substrates, certain metal or oxide thin film is coated over the surface region. On some soda lime glass substrates used for this application, there is no such thin film coating.

Figure 3:
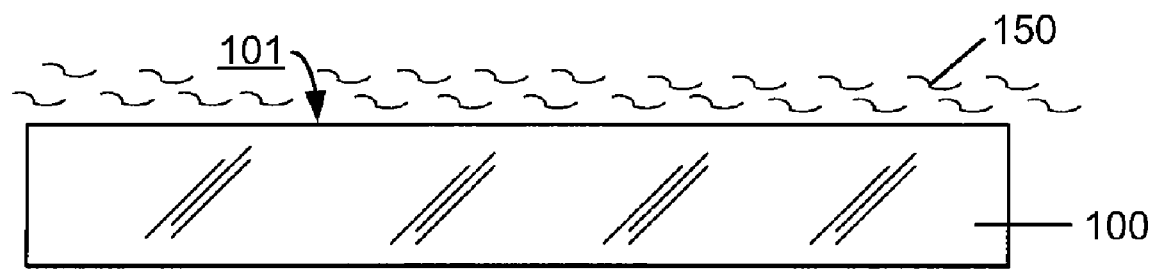

At Process 1020, a surface treatment is performed to the surface region of the soda lime glass substrate. As shown in FIG. 3, the surface region 101 of the soda lime glass substrate 100 is subjected to the treatment process 150. In one embodiment, the treatment process 150 is a washing process carried out by soaking into a fluidic environment or simply rinsing with deionized (DI) water with resistivity between 0.05 & 1 Mega Ohm-cm and controlled PH-value above 6.0 to 7.0. In one example, the soda lime glass substrates can be treated for 15 to 30 minutes under ultrasonic duty in isopropyl alcohol, washed in DI water, and finally dried by blowing with dry nitrogen. The washing process 150 substantially cleans the surface region 101 by removing surface contaminants, greases, dirt, dusts, and other particles with sizes greater than three microns.

Figure 4:
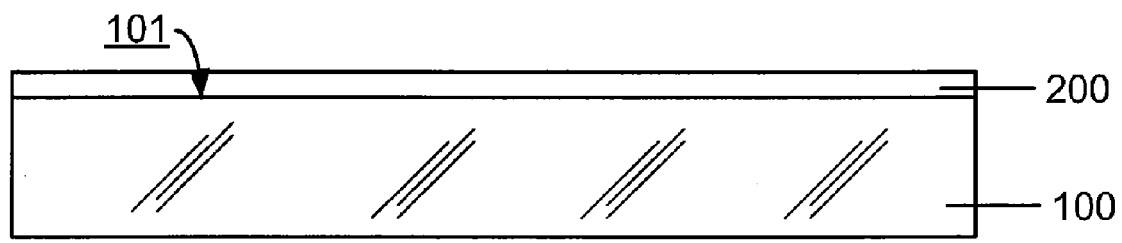

At next process (1030), the method includes forming a barrier layer overlying the surface region. This process can be visually illustrated by FIG. 4. FIG. 4 is a simplified diagram illustrating a barrier layer formed overlying the surface region of the soda lime glass substrate provided for fabricating a thin film solar cell according to an embodiment of the present invention. This diagram is merely an example, which should not unduly limit the scope of the claims herein. One of ordinary skill in the art would recognize many variations, alternatives, and modifications. As mentioned earlier, the grain growth of the photovoltaic materials on the soda lime glass substrate benefits from the existence of sodium-bearing species therein. However, it has been known that excessive supply of sodium-bearing species from the soda lime glass substrate would cause degradation of the crystallographic grain structure and correspondingly reduction of cell current, no-load voltage, or short-circuit current density, and other properties important for high efficiency solar cells. Especially during the photovoltaic thin film formation process on a heated substrate the sodium-bearing species inside the substrate would easily diffuse into the films overlying the substrate without control. In one example, instead of replacing the soda lime glass substrate with a non-sodium-bearing substrate, a barrier layer is added overlying the surface region of the soda lime glass substrate for maintaining the sodium-bearing species within the substrate or at least not diffusing across the surface region during the formation of thin film solar cells. As shown in FIG. 4, a thin barrier layer 200 is formed overlying the surface region 101 after a treatment process.

The barrier layer 200 is a silicon dioxide layer deposited using a sputtering process. For example, an AC sputtering process can be carried out in a chamber equipped with a silicon or silicon-aluminum tile target in an environment with injected oxygen gas at a controlled flow rate. In one implementation, Argon gas may be provided for assisting the sputtering process at about a suitable flow rate. In other implementations, DC sputtering, e-beam evaporation, thermal/chemical deposition, sol-gel method, or any other suitable techniques can be used. In a preferred embodiment, the AC sputtering process is performed with the soda lime glass substrate 100 being loaded into a vacuum chamber with a pressure of about $10^{-6}$ millitorr. The substrate temperature is at a room temperature. In a specific embodiment, the thickness of the thin barrier layer 200 is about 200 Angstroms and greater. In another specific embodiment, the thickness of the barrier layer 200 is about 500 Angstroms and greater. In certain embodiments, silicon oxide, aluminum oxide, titanium nitride, silicon nitride, titanium oxide, or zirconium oxide or certain combination of above materials can also be used as material for the thin barrier layer 200. For example, the barrier layer 200 can be formed by sputtering from an aluminum doped silicon target. The deposition is done in argon gas plus oxygen gas mixture. About 200 to 500 Angstroms thick film can be deposited, containing a mixture of $SiO_2$ and $Al_2O_3$.

In an alternative embodiment, other materials like titanium oxide, $SiON_x$, aluminum zinc oxide or a bi-layered film structure can be used for the barrier layer 200. For example, a two layer barrier can be deposited using following process. A first layer is deposited by sputtering on a target containing aluminum doped silicon. After that, a second layer is deposited using a pure silicon target. The carrier gas can be a mixture of argon and oxygen. The total thickness of the bi-layer barrier layer can be ranged from 200 to 2000 Angstroms.

Figure 5:
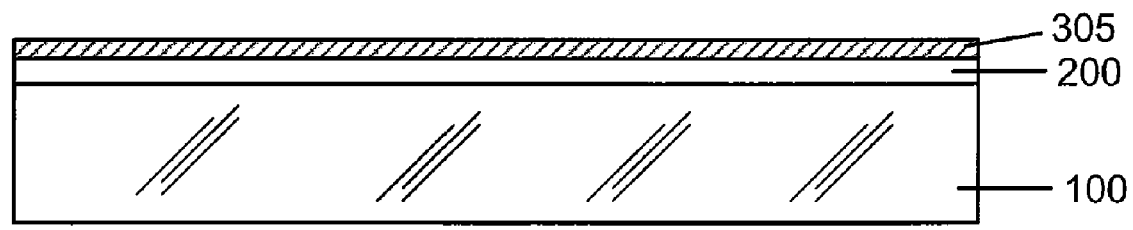

Referring to FIG. 1, the method further includes a process (1040) of forming a first molybdenum layer overlying the barrier layer. This process can be visually illustrated by FIG. 5. FIG. 5 is a simplified diagram illustrating a first molybdenum layer formed overlying the barrier layer according to an embodiment of the present invention. This diagram is merely an example, which should not unduly limit the scope of the claims herein. One of ordinary skill in the art would recognize many variations, alternatives, and modifications. As shown, the first molybdenum layer 305 is formed, using a first process, overlying the barrier layer 200. In one embodiment, the first molybdenum layer is a part of a bi-layered film formed in a first part of a complete metal deposition process. The first process is a low-pressure molybdenum sputtering process carried out in a compartment with a pressure of about 1 to 5 millitorr, leading to the first molybdenum layer 305 with a thickness of about 200 Angstroms to 700 Angstroms. In one implementation, this sputtering compartment for forming the first molybdenum layer 305 can be in a single chamber, but different compartment, as that for forming the barrier layer 200. In another embodiment, the first process is designed to provide the first molybdenum layer characterized as a film in substantial tensile stress. Depending also on the sputtering power and substrate temperature, other than the low-pressure condition, the first molybdenum layer 305 can be formed under tensile stress ranging from 300 MPa to 1000 MPa overlying the barrier layer 200. Of course, other stress levels can also be used depending upon the embodiment. In a preferred embodiment, the tensile stress within the first molybdenum layer 305 is configured to allow removal of the first molybdenum layer 305 via laser ablation for patterning from an underlying transparent substrate 100 (with a barrier layer 200). The tensile stress of the remaining portion of the first molybdenum layer 305 helps the remaining portion being strongly attached with the substrate 100 with the overlying barrier layer 200. More descriptions on the functional effect of the first molybdenum layer 305 during a patterning process of forming a lower electrode layer can be found in later paragraphs of the specification. Of course, there can be other variations, modifications, and alternatives.

Figure 6:
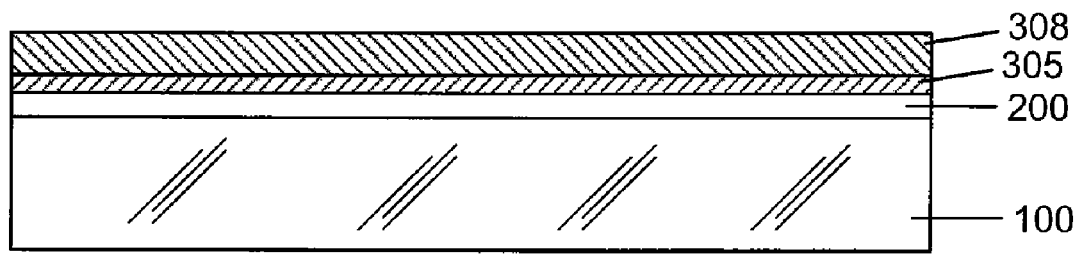

In a subsequent process (1050), the method 1000 includes forming a second molybdenum layer on the first molybdenum layer. This process can be visually illustrated by FIG. 6. FIG. 6 is a simplified diagram illustrating a second molybdenum layer formed overlying the first molybdenum layer according to an embodiment of the present invention. This diagram is merely an example, which should not unduly limit the scope of the claims herein. One of ordinary skill in the art would recognize many variations, alternatives, and modifications. As shown, a bi-layer structure is formed with the second molybdenum layer 308 overlying the first molybdenum layer 305. In particular, the second molybdenum layer 308 is formed in a second process, or a second part of a complete metal deposition process. The second process is a relative high-pressure molybdenum sputtering process carried out in a compartment with a pressure between 10 millitorr and 20 millitorr, leading to the second molybdenum layer 308 with a thickness of about 2000 Angstroms to 7000 Angstroms. Depending on the pressure and also on sputtering power and temperature, the second molybdenum layer 308 is formed under compressive stress ranging from stress neutral to −200 MPa, overlying the first molybdenum layer 305. In a preferred embodiment, the compressive stress within the second molybdenum layer 308 is configured to facilitate a self repairing of the film cracking or thin-edge-void within the first molybdenum layer 305 around the patterns formed during the laser ablation patterning process. Further details about the functional effect of the compressive second molybdenum layer over a tensile first molybdenum layer can be found in later paragraphs of the specification.

In an alternative embodiment, the bi-layer electrode process can be done using following optional conditions. For example, the process 1040 for forming the first molybdenum layer can be done at a low pressure of around 1-5 mtorr and a lower sputtering power of about 1-4 kW. The subsequent process (1050) for forming the second molybdenum layer uses high pressure about 10-20 mtorr combined with high sputtering power of about 12-18 kW. The thickness of each layer can be similar to that described above. Other options of the processing conditions can be utilized. For example, the pressure of the chamber can be kept constant for both sputtering processes. But the sputtering power can be set to low at 1-4 kW for the first molybdenum layer and increased to high at about 12-18 kW for the second molybdenum layer. Of course, there can be other variations, modifications, and alternatives. For example, the first layer can be deposited at low power but relative high pressure and the second layer at high power but relative low pressure. The stress nature of the bi-layer film structure is modified but the first layer still is in tensile and the second layer in compressive. Alternatively, the first molybdenum layer can be replaced by another material such as titanium. The thickness of the titanium layer is about 300 Angstroms. Furthermore, a titanium under layer can be added before the first molybdenum layer is formed.

Figure 7:
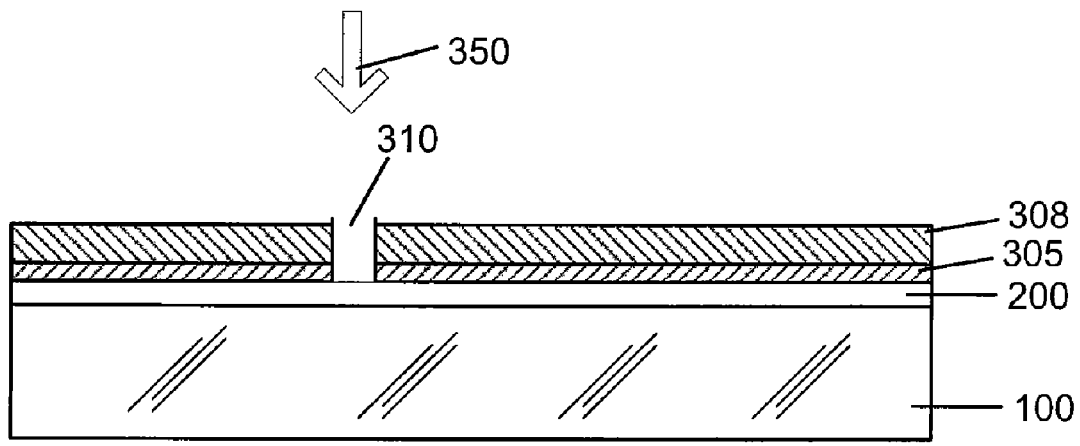

Referring to FIG. 1 again, the method includes a process (1060) of patterning the first molybdenum layer and the second molybdenum layer to form a lower electrode layer. This process can be visually illustrated by FIG. 7. FIG. 7 is a simplified diagram illustrating a lower electrode layer formed with a pattern according to an embodiment of the present invention. This diagram is merely an example, which should not unduly limit the scope of the claims herein. One of ordinary skill in the art would recognize many variations, alternatives, and modifications. As shown schematically, a pattern 310 is formed as a via with a depth through both the first molybdenum layer 305 and the second molybdenum layer 308. Here the pattern 310 is simplified as a rectangular shape having a width and a depth while other more complicated shapes can be formed or used depending on applications. In one implementation, the patterning process 1060 is a process utilizing an electromagnetic radiation 350 to form the pattern 310 by controllably removing a certain amount of the second molybdenum layer and the first molybdenum layer from the barrier layer 200 overlying the substrate 100. In particular, the electromagnetic radiation 350 can be a laser beam generated from a laser source based on Q-switched Nd: YAG infrared laser. Other laser with similar medium or frequency-doubled green laser can also be used. In one example, under a beam spot of the laser radiation 350 a portion the second molybdenum layer 308 and the first molybdenum layer 305 can be removed. Depending on beam spot size and ways of scanning the beam, the pattern 310 can have a width of about 20 to 50 micron.

Figure 7A:
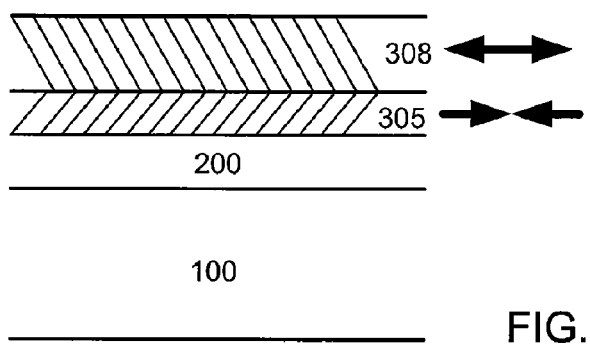
Figure 7B:
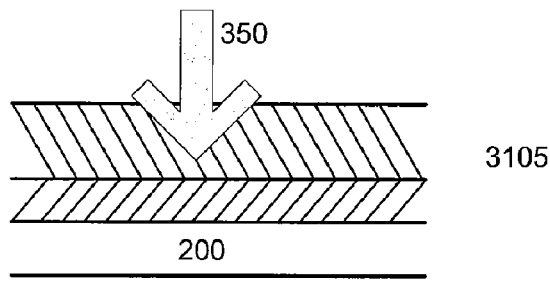
Figure 7C:
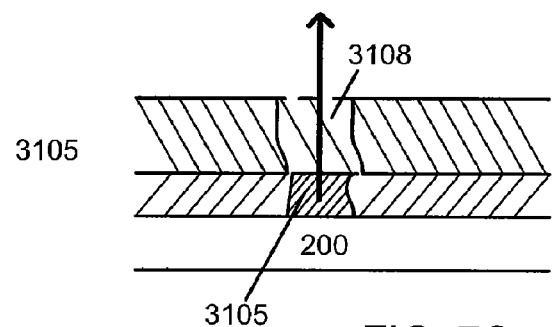

FIGS. 7A through 7E are schematic diagrams showing a functional effect of the bi-layered electrode layer for fabricating thin film solar cell according to an embodiment of the present invention. These diagrams are merely examples which should not unduly limit the scope of the claims herein. One of ordinary skill in the art would recognize many variations, alternatives, and modifications. As shown in FIG. 7A, a side view of the film illustrate a tensile first molybdenum layer 305 covered by a compressive second molybdenum layer 308, formed on a barrier layer 200 over the substrate 100. The tensile stress in the first molybdenum layer 305 tends to shrink the film while the compressive stress in the second molybdenum layer 308 tends to expand the film. During the patterning process, as shown in FIG. 7B, a laser beam 350 applied from above the second molybdenum layer 308 injects energy into the bi-layer molybdenum film. As the first molybdenum layer 305 under the laser beam 350 absorb (at least partially) the injected energy, the existed tensile stress helps to shrink the film (under the beam) to form a loosed portion 3105 of the first molybdenum layer 305. As shown in FIG. 7C, the loosed portion 3105 becomes removable from the underneath barrier layer 200. As sufficient energy injected by the laser beam is transferred into the loosed portion 3105 of first molybdenum layer 305 and the above portion 3108 of the second molybdenum layer 308, the materials within the portion 3105 and 3108 can be removed away from the barrier layer 200, as indicated by the arrow, to form a pattern 310.

Figure 7D:
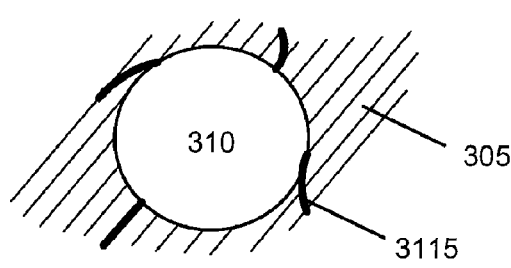
Figure 7E:
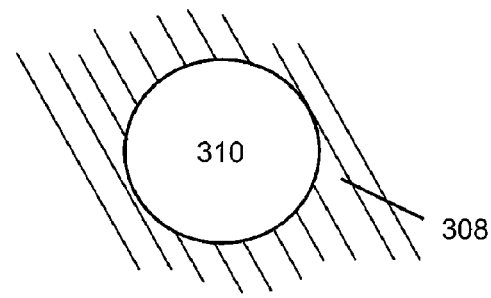

FIG. 7D shows a top view of the formed pattern 310, specifically showing a likely structure within a plane in the first molybdenum layer 305. Due to the existing tensile stress, the remaining portion of the first molybdenum layer 305 surrounding the pattern 310 still tends to shrink, which may cause formations of several cracks or voids 3115 near edges of the pattern 310. The edges of the remaining portion of the first molybdenum layer 305 near those cracks or voids 3115 may even become partially peeled off, capable of causing shunts or other degradations for subsequent layers if not being repaired. Embodiments of the present invention introduce a self-repairing mechanism using the compressive second molybdenum layer 308 over the first molybdenum layer 305 during the patterning process to form the lower electrode layer. In particular, the compressive stress in the remaining portion of the second molybdenum layer 308 around the pattern 310 tends to automatically expand at the same time as the first molybdenum layer 305 tends to form those cracks 3115. Effectively, as shown in FIG. 7E of a plane view of the same pattern 310 surrounded by the second molybdenum layer 308, no cracks are seen around the pattern edge and elsewhere. In other words, any cracks formed in the first molybdenum layer 305 are effectively repaired or filled by expanding second molybdenum layer 308. The rest portion of the first molybdenum layer 305, covered by corresponding remaining portion of the second molybdenum layer 308, is still in tensile stress that helps to hold the film tightly onto the barrier layer 200. Therefore, the specific bi-layer structure associated with the first molybdenum layer and the second molybdenum layer and corresponding tensile/compressive stress configuration successfully reduce film cracking during the patterning process that leads to a formation of a lower electrode layer for the thin film solar cell to be formed later. In one example, the formed pattern by the process 1060 is substantially free from the random voids, cracks, berms of sizes smaller than 0.1 microns.

In a specific embodiment, when the soda lime glass is used as a superstrate the patterned electrode layer 300 including both the first molybdenum layer and the second molybdenum layer can serve as an upper electrode layer for a top solar cell. In particular, the upper electrode layer needs to be optically transparent. For molybdenum layer with thickness of about 0.5 microns or less, it is optically transparent to visible light. In other examples, transparent conductive oxide can be used as the material for the upper electrode layer. Of course, there can be other variations, modifications, and alternatives.

Figure 8:
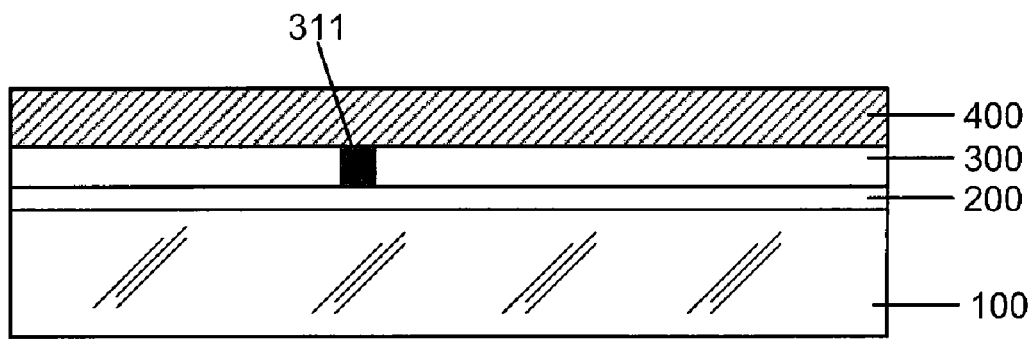

In the next process (1070), a layer of photovoltaic material is produced over the lower electrode layer. This process can be visually illustrated by FIG. 8. FIG. 8 is a simplified diagram illustrating a layer of photovoltaic material formed overlying the lower electrode layer for fabricating a thin film solar cell on soda lime glass according to an embodiment of the present invention. This diagram is merely an example, which should not unduly limit the scope of the claims herein. One of ordinary skill in the art would recognize many variations, alternatives, and modifications. As shown, the layer of photovoltaic material 400 is applied on the lower electrode layer 300. In one embodiment, the layer of photovoltaic material is a multilayered structure that is formed by a series of thin film deposition, anneal treatment, etching treatment, mechanical or laser patterning, doping or implantation, and other suitable processes. For example, the layer of photovoltaic material 400 can be formed by a sputtering process using a copper-gallium alloy target and an indium target with a atomic purity up to 99%. The sputtering process includes multi-steps, each step with predominantly one type of material (either copper or indium) being deposited, carried out in a separate compartment within a single chamber at a temperature of about 500 degree Celsius. In a specific embodiment, a conductive material can be filled into the pattern 310 to form an interconnect structure 311 within the lower electrode layer 300 before or during the formation of the layer of photovoltaic material 400. Depending on the applications, the sputtering process can be replaced by other techniques including vacuum evaporation, plating, chemical vapor deposition, or chemical bath deposition.

In another specific embodiment, the sputtering process is followed by or substantially carried out at the same time with a sodium-bearing species coating process to add a desired amount of sodium-bearing species or other alkaline ions into the films. Subsequently, the copper-indium materials (or copper indium gallium materials) deposited earlier plus the desired amount of sodium-bearing species can be treated by a thermal process under a specific environment including selenide (or sulfide in certain embodiment) in fluidic phase, leading to a selenization process to form a film of copper indium (gallium) diselenide compound with crystal grains in substantially chalcopyrite structure. In certain embodiment, the film of copper indium(gallium)diselenide (CIS or CIGS) in chalcopyrite structure becomes a photovoltaic absorber layer for fabricating a thin film solar cell. In one specific embodiment, during the multi-step sputtering deposition and subsequent thermal process with the barrier layer 200 (formed at Process 1030) the sodium content within the soda lime glass substrate 100 is substantially maintained with the substrate thereof at elevated processing temperatures. Therefore, the method 1000 according to embodiments of the present invention ensures no uncontrolled sodium-bearing species are introduced into the films formed above the surface region of the soda lime glass substrate. In fact, this barrier layer 200 also advantageously prevents excessive sodium from causing a reactive injury to the lower electrode layer 300 made by molybdenum material.

Figure 9:
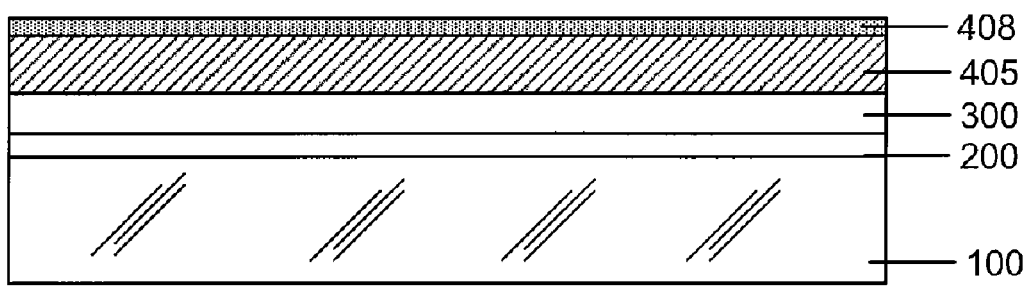

In an alternative embodiment, the photovoltaic material in the multilayered structure functionally can include at least one absorber layer and one window layer overlying the absorber layer, serving as basic solar cell elements for collecting sun light and converting into electricity. As shown in FIG. 9 in an example, the absorber layer 405 can be the thin film in chalcopyrite structure made by copper indium(gallium)diselenide (CIS or CIGS) compound material. In another example, the absorber layer 405 can be a copper indium gallium disulfide compound semiconductor material or copper indium disulfide compound semiconductor material. The absorber layer 405 usually is characterized as a p-type semiconductor through one or more doping process. Typically p-type acceptor dopants include boron or aluminum ions. In certain embodiments of the invention, the absorber layer 405 mentioned above can be produced by sputtering, plating, evaporation, and other suitable deposition plus the selenization or sulfurization and one or more thermal processes. Although the above has been generally described in terms of a specific structure for CIS and/or CIGS thin film cells, other specific CIS and/or CIGS configurations can also be used, such as those noted in U.S. Pat. No. 4,612,411 and U.S. Pat. No. 4,611,091, which are hereby incorporated by reference herein, without departing from the invention described by the claims herein.

As shown in FIG. 9, the absorber layer 405 is overlaid by a window layer 408 characterized as a wide bandgap semiconductor with a photovoltaic junction. In one example, the window layer can be selected from a group materials consisting of a cadmium sulfide (CdS), a zinc sulfide (ZnS), zinc selenium (ZnSe), zinc oxide (ZnO), zinc magnesium oxide (ZnMgO), or others and may be doped with impurities for conductivity, e.g., $n^+$-type. Sputtering, vacuum evaporation, and chemical bath deposition (CBD) techniques are widely used for the formation of the window layer. In particular, CBD is an inexpensive and convenient method for large-area preparation of thin window layer at close-to-room temperatures, where a controllable chemical reaction in an aqueous solution, containing the various reactants, is involved. In another example, indium species are used as the doping element to cause formation of the n$^+$-type semiconductor characteristic. In a specific embodiment, the absorber layer 405 resulted from the above processes is about 1 to 10 microns in thickness, but can be other dimensions. The window layer 408 usually is thinner than the absorber layer 405. In one implementation, a window layer 408 of CdS material made by a CBD method can have a thickness ranging from about 200 to 500 nanometers. Of course, there can be other variations, alternatives, and modifications.

Figure 10:
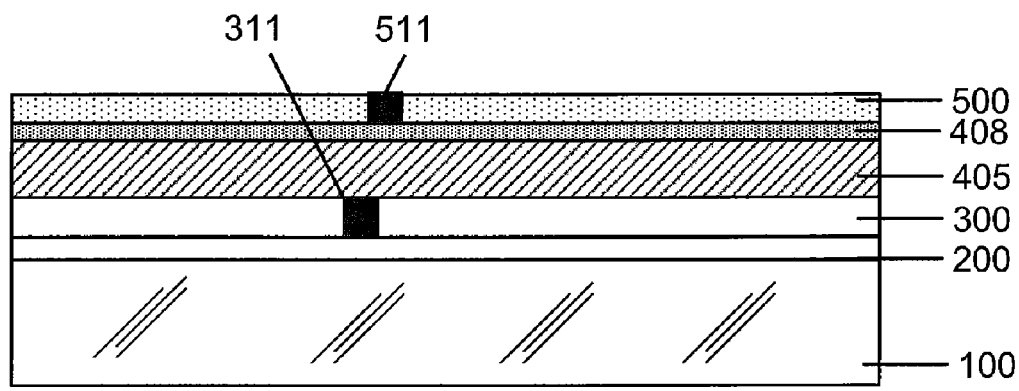

Referring back to FIG. 1, the method further includes a process (1080) of forming a first zinc oxide layer overlying the layer of photovoltaic material. This process can be visually illustrated by FIG. 10. FIG. 10 is a simplified diagram illustrating a first zinc oxide layer formed over the layer of photovoltaic material for fabricating a thin film solar cell on soda lime glass according to an embodiment of the present invention. This diagram is merely an example, which should not unduly limit the scope of the claims herein. One of ordinary skill in the art would recognize many variations, alternatives, and modifications. As shown, the first zinc oxide layer 500 forms overlying the layer of photovoltaic material 400 that is formed in previous process (1070). As an example, the first zinc oxide layer 500 includes an interconnect structure 511 that can be formed by a patterning process carried out after the Process 1080. Functionally, the first zinc oxide layer 500 serves as an upper (or front) electrode layer for the thin film solar cell formed on the soda lime glass substrate. In a specific embodiment, the first zinc oxide layer 500 can be a properly n-type doped to make it electrically conductive. The n-type doping is possible by introduction of boron, aluminum, indium, or excess zinc. Normally the zinc oxide is optically transparent as a so-called transparent conducting oxide (TCO) material and often used in thin film solar devices. Other materials, for example, Indium tin oxide (ITO) and fluorine doped tin oxide (TFO) can also be used. In certain embodiment, the first zinc oxide layer is formed using a metalorganic chemical vapor deposition (MOCVD) technique within a batch system. The formed first zinc oxide layer by MOCVD is a rough layer, which can diffuse the incoming light by scattering, increasing the efficiency of solar cells.

In a specific embodiment, the first zinc oxide layer is formed over the window layer overlying the copper indium diselenide absorber layer of the photovoltaic material. In one example, the window layer 408 is a cadmium sulfide layer formed using the CBD technique. The cadmium sulfide layer can be deposited after the formation of the copper indium diselenide absorber layer or the copper indium gallium diselenide absorber layer.

Figure 11:
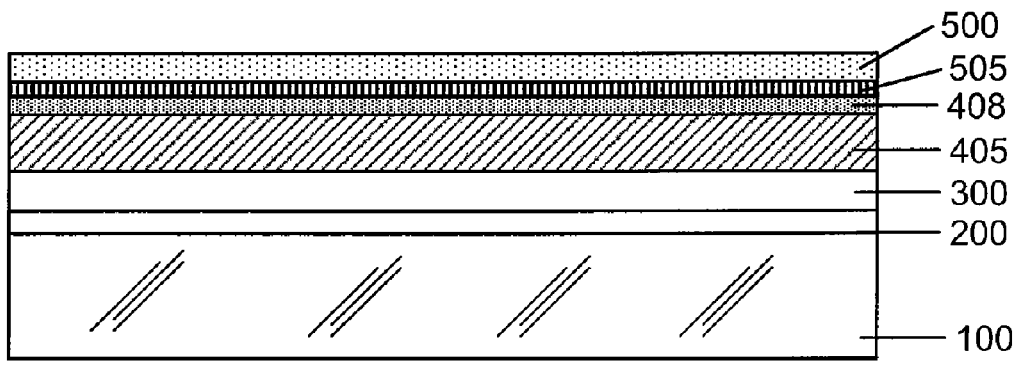

FIG. 11 is a simplified diagram illustrating a second zinc oxide layer formed overlying the layer of photovoltaic material before the formation of the first zinc oxide layer according to an alternative embodiment of the present invention. This diagram is merely an example, which should not unduly limit the scope of the claims herein. As shown, the second zinc oxide layer 505 is sandwiched between the first zinc oxide layer 500 and the layer of photovoltaic material 400. In a specific embodiment, the second zinc oxide layer 505 has a higher resistivity than the first zinc oxide layer 500. Referring to FIG. 1, the method includes performing other processes (1090). In one embodiment, forming a second zinc oxide layer is one optional process 1090.

Figure 12:
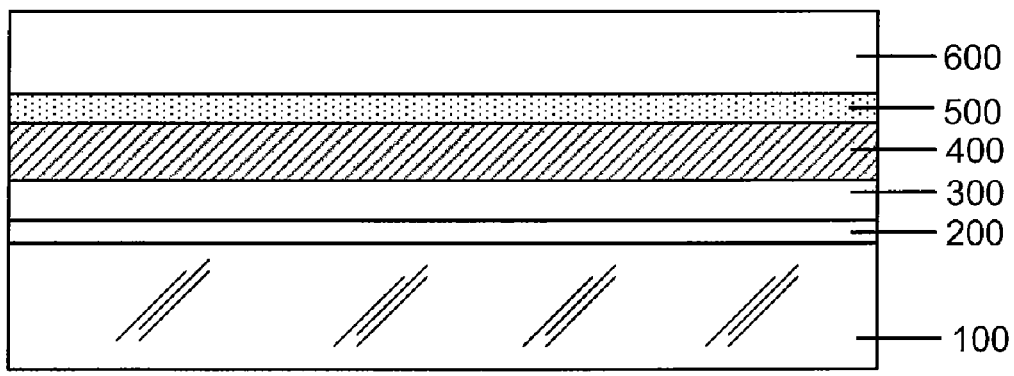

FIG. 12 is a simplified diagram illustrating one or more layers formed according to certain embodiments of the invention. This diagram is merely an example, which should not unduly limit the scope of the claims herein. Firstly, a layered structure including the soda lime glass substrate 100, the barrier layer 200, the first electrode layer 300, the layer of photovoltaic material 400, and the first zinc oxide layer (or the second electrode layer) creates a basic structure for fabricating a first thin film solar cell. Then as shown in FIG. 12, one or more layers 600 can be provided (or assembled) over the top of the first thin film solar cell, i.e., over the first zinc oxide layer 500 of the above layered structure. The added one or more layers 600 simply can be a second thin film solar cell formed by similar method while using a soda lime glass superstrate. For example, the one or more layers 600 represent another copper indium diselenide layer sandwiched by transparent electrode layers with proper patterned interconnect structures to form a photovoltaic cell structure. In certain embodiments, the other processes 1090 can include forming the second solar cell including the one or more layers 600 and assembling the second thin film solar cell with the first thin film solar cell to form a multi-junction module.

Figure 13:
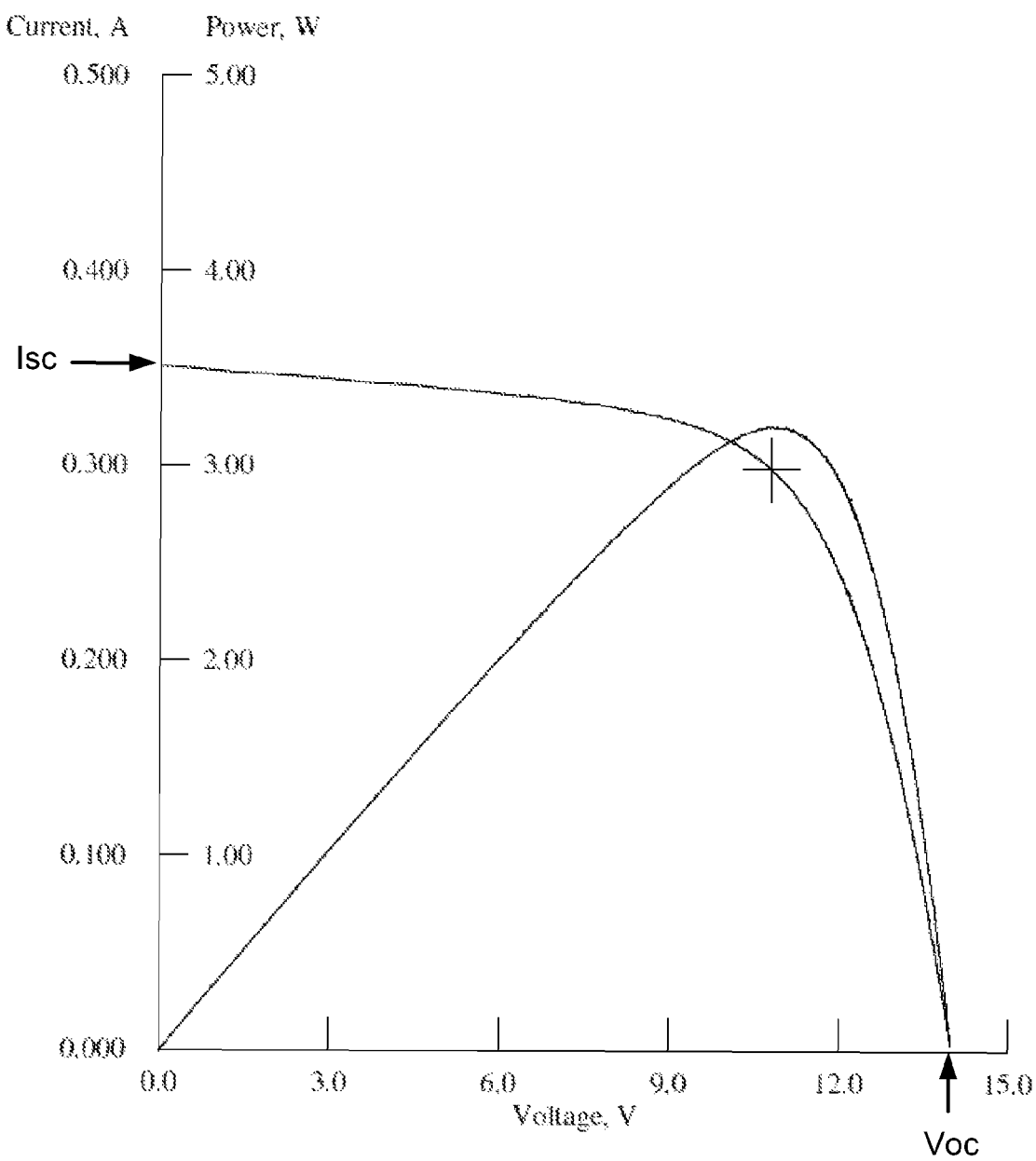
FIGS. 13 and 14 are tested IV characteristics of thin film solar modules fabricated according to embodiments of the present invention.
Figure 14:
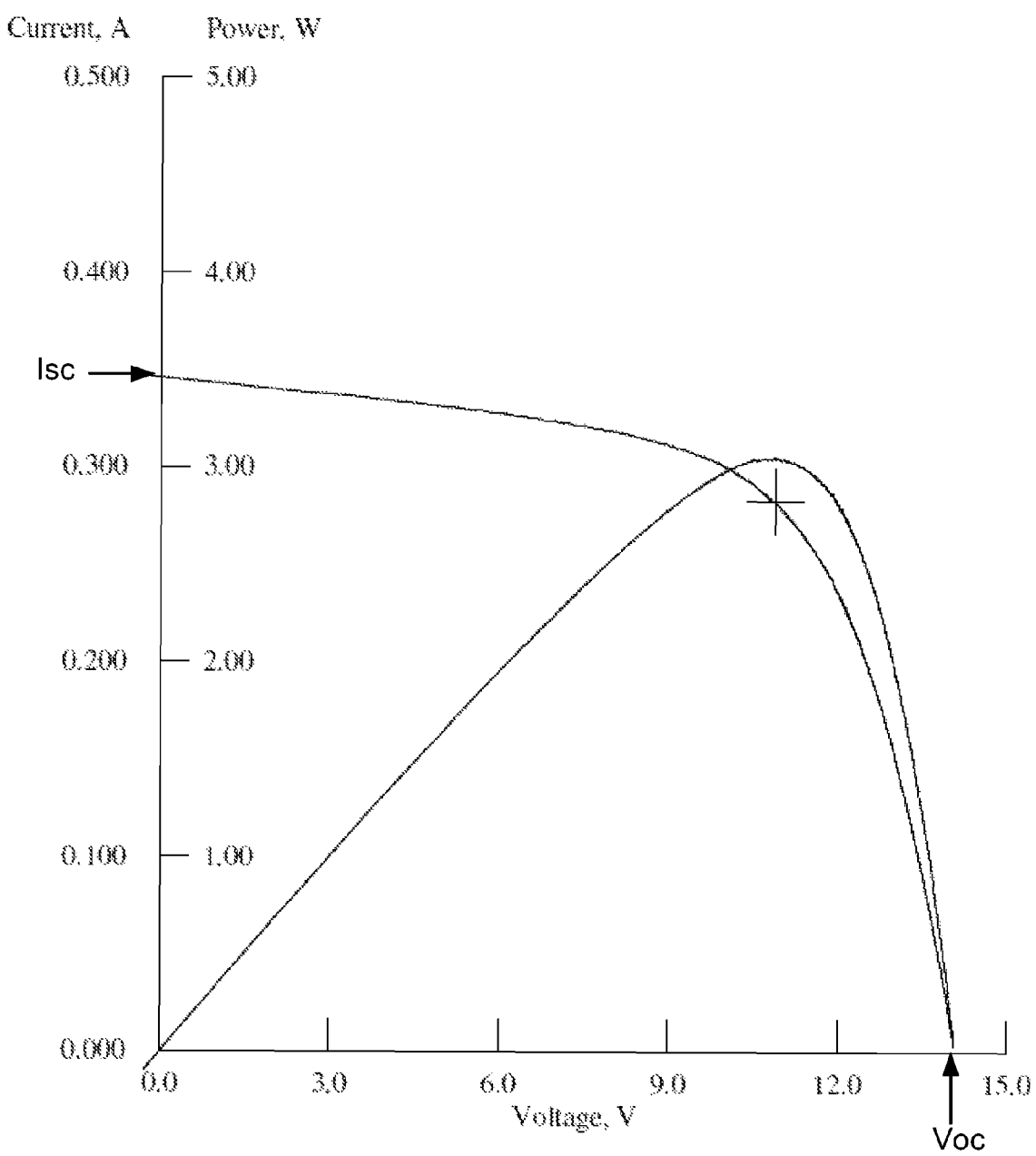

FIGS. 13 and 14 are tested IV characteristics of thin film solar modules fabricated according to embodiments of the present invention. FIG. 13 shows an IV characteristic of a thin film solar module of 20 cm×20 cm made on a soda lime glass substrate according to an embodiment of the present invention. In particular, the solar cell has a bi-layered electrode formed on a barrier layer overlying the glass substrate. In this example, the barrier can be any of those noted, but can be others. The bi-layered electrode comprises a first molybdenum (Mo) layer in tensile stress configuration and a second molybdenum layer in compressive stress overlying the first Mo layer according to this example. The first Mo layer is formed by sputtering Mo target at low pressure of about 2 mtorr and low power of 1-4 kW. The second Mo layer is formed by sputtering Mo target at high pressure of about 20 mtorr and high power of 12-18 kW. As seen in FIG. 13, the short circuit current $I_{sc}$ of the module is about 0.35 A and the open circuit voltage $V_{oc}$ is about 13.91 Volt. In this example, the module efficiency is about 11%. Of course, there can be other variations, modifications, and alternatives.

Alternatively, FIG. 14 shows an IV characteristic of another thin film solar module of 20 cm×20 cm made on a soda lime glass substrate according to an embodiment of the present invention. This cell has a Mo bi-layer electrode film overlying a barrier layer on the substrate. In this example, the barrier can be any of those noted, but can be others. The process condition for this bi-layer Mo electrode is at a constant pressure for both layers of the bi-layer structure but the first Mo layer is done with a lower power with the second Mo layer is done with a higher power. As seen in FIG. 14, the short circuit of the module is measured to be 0.34 A and the open circuit voltage of the module is about 14 V. The module efficiency is about 10.5%. Of course, there can be other variations, modifications, and alternatives.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a thin film solar cell, the method comprising:

providing a soda lime glass substrate comprising a surface region and a concentration of sodium oxide of greater than about 10 percent by weight;

treating the surface region with one or more cleaning process, using a deionized water rinse, to remove surface contaminants having a particles size of greater than three microns;

forming a barrier layer overlying the surface region, the barrier layer being characterized to maintain the sodium within the soda lime glass substrate;

forming a first molybdenum layer using a first process having a first pressure, the first molybdenum layer having a first thickness and being in tensile configuration, overlying the barrier layer;

forming a second molybdenum layer using a second process having a second pressure, the second molybdenum layer having a second thickness, which is greater than the first thickness, and being in compressive configuration, overlying the first molybdenum layer, wherein the second pressure is greater than the first pressure;

patterning the first molybdenum layer and the second molybdenum layer to form a lower electrode layer;

forming a first interconnect structure by filling a pattern formed in the first molybdenum layer and the second molybdenum layer, wherein a first height of the first interconnect structure is substantially equal to a thickness of the lower electrode layer;

forming a layer of photovoltaic material overlying the lower electrode layer; and forming a first zinc oxide layer overlying the layer of photovoltaic material.

2. The method of claim 1 wherein the first process comprises using a sputtering technique and wherein the first pressure is between 1 millitorr and 5 millitorr.

3. The method of claim 1 wherein the second process comprises using a sputtering technique and wherein the second pressure is between 10 millitorr and 20 millitorr.

4. The method of claim 1 wherein the first process comprises using a sputtering power ranging from 1 to 4 kW.

5. The method of claim 1 wherein the second process comprises using a sputtering power ranging from 12 to 18 kW.

6. The method of claim 1 wherein the patterning the first molybdenum layer and the second molybdenum layer comprises laser ablating through both the first molybdenum layer and the second molybdenum layer to form a pattern with a width about 25 to 50 microns and substantially free from the random voids, cracks, berms of sizes smaller than 0.1 microns.

7. The method of claim 1 wherein the barrier layer comprises a silicon dioxide material mixed with aluminum oxide material having a thickness of about 200 Angstroms and greater.

8. The method of claim 1 wherein forming the layer of photovoltaic material comprises forming a copper indium gallium diselenide absorber layer overlying the lower electrode layer and forming a window layer overlying the copper indium gallium diselenide absorber layer.

9. The method of claim 1 further comprising forming a second zinc oxide layer overlying the layer of photovoltaic materials before forming the first zinc oxide layer, the first zinc oxide layer having a lower resistivity than the second zinc oxide layer.

10. The method of claim 1 further comprising forming a second interconnect structure within the first zinc oxide layer, wherein a second height of the second interconnect structure is substantially equal to a thickness of the first zinc oxide layer.

11. A method for fabricating a thin film solar cell, the method comprising:

providing a soda lime glass substrate comprising a surface region and a concentration of sodium oxide of greater than about 10 percent by weight;

forming a barrier layer overlying the surface region, the barrier layer being characterized to maintain sodium within the soda lime glass substrate;

forming a first molybdenum layer using a first process having a first pressure, the first molybdenum layer having a first thickness and being in tensile configuration, overlying the barrier layer;

forming a second molybdenum layer using a second process having a second pressure, the second molybdenum layer having a second thickness, and being in compressive configuration, overlying the first molybdenum layer, wherein the second pressure is higher than the first pressure;

patterning the first molybdenum layer and the second molybdenum layer to form a lower electrode layer;

forming an interconnect structure characterized by a first height, the first height being substantially equal to a combination of the first thickness and the second thickness;

forming an absorber material comprising a copper species, a gallium species, an indium species, and a selenium species overlying the lower electrode layer; and forming a first zinc oxide layer overlying the absorber material.

12. The method of claim 11 wherein the first thickness is about 200 Angstroms to 700 Angstroms and the second thickness is about 10 times of the first thickness.

13. The method of claim 11 wherein the patterning the first molybdenum layer and the second molybdenum layer comprises laser ablating through both the first molybdenum layer and the second molybdenum layer to form a pattern with a width about 25 to 50 microns and substantially free from the random voids, cracks, berms of sizes smaller than 0.1 microns.

14. The method of claim 11 further comprising forming a second zinc oxide layer overlying the layer of photovoltaic materials before forming the first zinc oxide layer, the first zinc oxide layer having a lower resistivity than the second zinc oxide layer.

15. The method of claim 11 further comprising forming another interconnect structure characterized by a second height substantially equal to a thickness of the first zinc oxide layer.

16. A method comprising:

forming a barrier layer overlying a surface region of a substrate;

forming a first tensile molybdenum layer at a first pressure overlying the barrier layer;

forming a second compressive molybdenum layer at a second pressure, the second molybdenum layer overlying the first molybdenum layer, wherein the second pressure is higher than the first pressure and the second molybdenum layer is thicker than the first molybdenum layer;

forming a first interconnect structure having a first height, wherein the first height is substantially equal to a combined thickness of the first tensile molybdenum layer and the second compressive molybdenum layer;

forming an absorber material comprising a copper species, a gallium species, an indium species, and a selenium species overlying the second compressive molybdenum layer; and forming a window layer overlying the absorber material.

17. The method of claim 16 further comprising forming a second interconnect structure within the window layer, wherein a second height of the second interconnect structure is substantially equal to a thickness of the window layer.

* * * * *